United States Patent
Meiser et al.

(10) Patent No.: US 9,673,320 B2
(45) Date of Patent: Jun. 6, 2017

(54) TRANSISTOR WITH IMPROVED AVALANCHE BREAKDOWN BEHAVIOR

(71) Applicant: Infineon Technologies AG, Neubiberg (DE)

(72) Inventors: Andreas Meiser, Sauerlach (DE); Till Schloesser, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/182,120

(22) Filed: Jun. 14, 2016

(65) Prior Publication Data

US 2016/0365443 A1 Dec. 15, 2016

(30) Foreign Application Priority Data

Jun. 15, 2015 (DE) .................. 10 2015 109 538

(51) Int. Cl.

| H01L 29/78 | (2006.01) |
|---|---|
| H01L 29/06 | (2006.01) |
| H01L 29/10 | (2006.01) |
| H01L 29/40 | (2006.01) |
| H01L 29/66 | (2006.01) |

(52) U.S. Cl.
CPC ...... *H01L 29/7819* (2013.01); *H01L 29/0696* (2013.01); *H01L 29/1095* (2013.01); *H01L 29/407* (2013.01); *H01L 29/408* (2013.01); *H01L 29/66704* (2013.01); *H01L 29/7825* (2013.01)

(58) Field of Classification Search
CPC ............ H01L 29/7819; H01L 29/0696; H01L 29/1095; H01L 29/407; H01L 29/408; H01L 29/66709; H01L 29/7825
See application file for complete search history.

(56) References Cited

U.S. PATENT DOCUMENTS

| 6,936,890 B2 * | 8/2005 | Hueting ............. H01L 29/0696 257/330 |
| 7,400,014 B2 * | 7/2008 | Thapar .................. H01L 29/407 257/330 |

(Continued)

FOREIGN PATENT DOCUMENTS

DE 102004005775 A1 8/2005

*Primary Examiner* — Ida M Soward
(74) *Attorney, Agent, or Firm* — Murphy, Bilak & Homiller, PLLC (57) ABSTRACT

A transistor cell includes a drift region, a source region, a body region, and a drain region that is laterally spaced apart from the source region. A gate electrode is adjacent the body region. A field electrode is arranged in the drift region. A source electrode is connected to the source region and the body region, and a drain electrode is connected to the drain region. An avalanche bypass structure is coupled between the source electrode and the drain electrode and includes a first semiconductor layer of the first doping type, a second semiconductor layer of the first doping type, and a pn-junction arranged between the first semiconductor layer and the source electrode. The second semiconductor layer has a higher doping concentration than the first semiconductor layer and is arranged between the second semiconductor layer and the drift region. The drain electrode is electrically connected to the second semiconductor layer.

18 Claims, 6 Drawing Sheets

(56) References Cited

U.S. PATENT DOCUMENTS

| | | | |
|---|---|---|---|
| 8,247,296 B2* | 8/2012 | Grivna | H01L 29/407 |
| | | | 257/E21.41 |
| 8,921,934 B2* | 12/2014 | Ng | H01L 29/407 |
| | | | 257/302 |
| 8,928,075 B2* | 1/2015 | Kocon | H01L 27/088 |
| | | | 257/337 |
| 9,076,671 B2* | 7/2015 | Kocon | H01L 27/088 |
| 9,306,058 B2* | 4/2016 | Vielemeyer | H01L 29/7816 |
| 9,419,130 B2* | 8/2016 | Meiser | H01L 29/7825 |
| 9,431,490 B2* | 8/2016 | Schulze | H01L 29/402 |
| 2006/0076621 A1* | 4/2006 | Hirler | H01L 29/0634 |
| | | | 257/343 |
| 2007/0108469 A1 | 5/2007 | Nakano et al. | |
| 2013/0248998 A1* | 9/2013 | Misu | H01L 29/7801 |
| | | | 257/335 |
| 2014/0151798 A1 | 6/2014 | Meiser et al. | |
| 2015/0187761 A1* | 7/2015 | Irsigler | H01L 21/225 |
| | | | 257/334 |

* cited by examiner

TRANSISTOR WITH IMPROVED AVALANCHE BREAKDOWN BEHAVIOR

PRIORITY CLAIM

This application claims priority to German Patent Application No. 10 2015 109 538.6 filed on 15 Jun. 2015, the content of said application incorporated herein by reference in its entirety.

BACKGROUND

This disclosure in general relates to a transistor device, in particular a lateral MOSFET (Metal Oxide Semiconductor Field-Effect Transistor).

Transistors, such as MOSFETs, are widely used in automotive, industrial, or consumer electronic applications for driving loads, converting power, or the like. Those transistors, which are often referred to as power transistors, are available with different voltage blocking capabilities. The "voltage blocking capability" defines the maximum voltage level the transistor can withstand in an off-state (when switched off). When, in the off-state, a voltage with a level higher than this maximum voltage level is applied to the transistor an avalanche breakthrough may occur at an internal pn-junction of the transistor.

It is desirable to design a transistor, in particular a MOSFET, such that it can withstand an avalanche breakthrough repetitively without being destroyed or without being subject to degradation effects such as, for example, a reduction of the voltage blocking capability.

SUMMARY

One embodiment relates to a transistor device with at least one transistor cell. The at least one transistor cell includes, in a semiconductor body, a drift region of a first doping type, a source region of a first doping type, a body region of a second doping type, and a drain region of the first doping type, wherein the body region is arranged between the source region and the drift region, wherein the drift region is arranged between the body region and the drain region, and wherein the source region and the drain region are spaced apart in a first lateral direction of the semiconductor body. A gate electrode is adjacent the body region and dielectrically insulated from the body region by a gate dielectric. A field electrode is arranged in the drift region and dielectrically insulated from the drift region by a field electrode dielectric. A source electrode electrically is connected to the source region and the body region and arranged in a trench extending from a first surface into the semiconductor body, and a drain electrode electrically connected to the drain region and arranged in a trench extending from a first surface into the semiconductor body. Furthermore, an avalanche bypass structure is coupled between the source electrode and the drain electrode and includes a first semiconductor layer of the first doping type, a second semiconductor layer of the first doping type, and a pn-junction arranged between the first semiconductor layer and the source electrode, wherein the second semiconductor layer has a higher doping concentration than the first semiconductor layer, wherein the first semiconductor layer is arranged between the second semiconductor layer and the drift region, and wherein the drain electrode is electrically connected to the second semiconductor layer.

Another embodiment relates to a method for forming a transistor device having at least one transistor cell. The method includes forming an avalanche bypass structure coupled between a source electrode and a drain electrode and comprising a first semiconductor layer of a first doping type, a second semiconductor layer of the first doping type, and a pn-junction arranged between the first semiconductor layer and the source electrode. The source electrode and the drain electrode are spaced apart in a lateral direction of the semiconductor body. The second semiconductor layer has a higher doping concentration than the first semiconductor layer. The first semiconductor layer is arranged between the second semiconductor layer and a drift region, and the drain electrode is electrically connected to the second semiconductor layer.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF THE DRAWINGS

In the following detailed description, reference is made to the accompanying drawings. The drawings form a part of the description and by way of illustration show specific embodiments of how the invention may be practiced. It is to be understood that the features of the various embodiments described herein may be combined with each other, unless specifically noted otherwise.

Figure 1A:
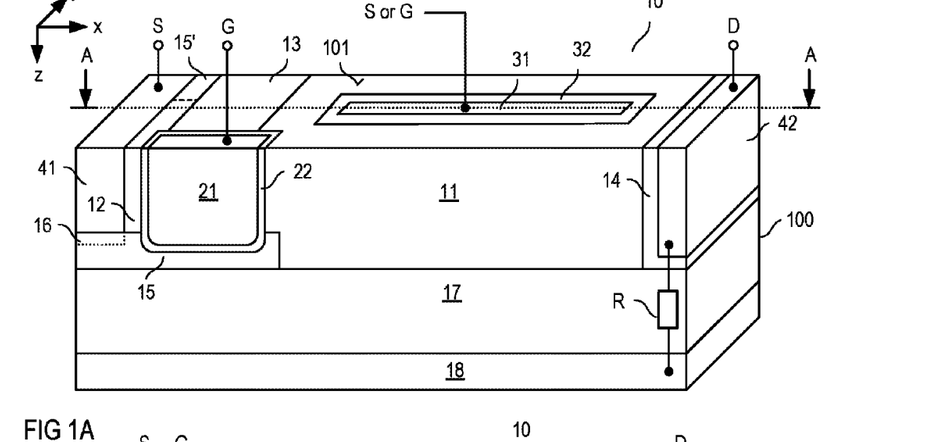
FIGS. 1A-1B show a perspective sectional view (FIG. 1A) and a vertical cross-sectional view (FIG. 1B) of a transistor device according to one embodiment.
Figures 1B, 2, 3, 4:
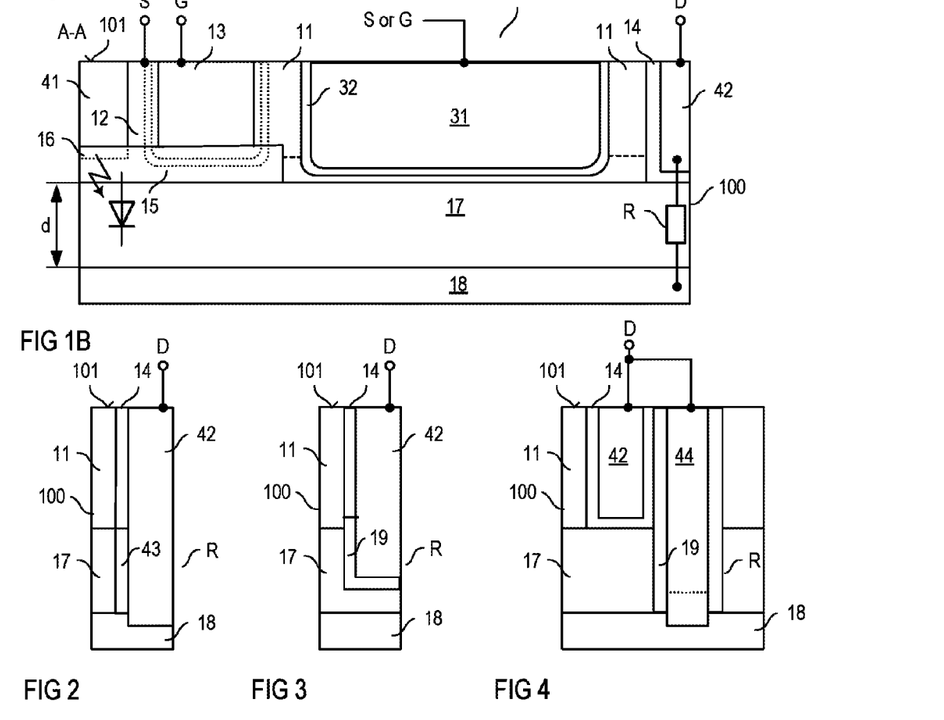
FIG. 2 shows one embodiment of an electrical connection between a drain electrode and an avalanche bypass structure in the transistor device.
FIG. 3 shows another embodiment of an electrical connection between a drain electrode and an avalanche bypass structure in the transistor device.
FIG. 4 shows another embodiment of an electrical connection between a drain electrode and an avalanche bypass structure in the transistor device.

FIG. 1A shows a perspective sectional view and FIG. 1B shows a vertical cross sectional view of one transistor cell 10 of a transistor device according to one embodiment. Referring to FIGS. 1A-1B, the transistor cell 10 includes, in a semiconductor body 100, a drift region 11 of a first doping type, a source region 12 of a first doping type, a body region 13 of a second doping type, and a drain region 14 of the first doping type. The body region 13 is arranged between the source region 12 and the drift region 11, and the drift region 11 is arranged between the body region 13 and the drain region 14. The source region 12 and the drain region 14 are spaced apart in a first lateral direction x of the semiconductor body 100.

According to one embodiment, the source region 12 adjoins the body region 13, and the body region 13 adjoins the drift region 11. As the body region 13 and the drift region 11 have complementary doping types, there is a pn-junction between the body region 13 and the drift region 11. In the embodiment shown in FIG. 1A, the drain region 14 adjoins the drift region 11. However, this is only an example. According to another embodiment (not shown) a field-stop region of the same doping type as the drain 14 and the drift region 11, but more highly doped than the drift region 11, is arranged between the drift region 11 and the drain region 14.

The semiconductor body 100 may include a conventional semiconductor material such as, for example, silicon (Si), silicon carbide (SiC), gallium arsenide (GaAs), gallium nitride (GaN), or the like. If the semiconductor body 100 is comprised of silicon, the doping concentrations of the individual device regions may be as follows. For example, in a transistor device with a semiconductor body 100 made of Si, the doping concentration of the drift region 11 is selected from a range of between $1E12\ cm^{-3}$ and $1E14\ cm^{-3}$, the doping concentration of the source region 12 is selected from a range of between $1E19\ cm^{-3}$ and $1E21\ cm^{-3}$, the doping concentration of the drain region 14 is selected from a range of between $1E19\ cm^{-3}$ and $1E21\ cm^{-3}$, and the doping concentration of the body region 13 is selected from a range of between $1E14\ cm^{-3}$ and $1E18\ cm^{-3}$.

Referring to FIGS. 1A and 1B, the transistor device 10 further includes a gate electrode 21 (shown in dotted lines in FIG. 1B as it is out of the section plane A-A shown in FIG. 1B). The gate electrode 21 is adjacent the body region 13 and is dielectrically insulated from the body region 13 by a gate dielectric 22. In the first lateral direction x, the gate electrode 21 extends from the source region 12 to the drift region 11 so that it can control a conducting channel in the body region 13 along the gate dielectric 22 between the source region 12 and the drift region 11. In the embodiment shown in FIGS. 1A and 1B, the gate electrode 21 is a trench electrode. That is, the gate electrode 21 is arranged in a trench that extends from a first surface 101 in a vertical direction z of the semiconductor body 100. The gate electrode may include a conventional gate electrode material. Examples of the gate electrode material include, but are not restricted to, a metal, a silicide, and a highly doped polycrystalline semiconductor material, such as polysilicon. The gate dielectric may include a conventional gate dielectric material. Examples of the gate dielectric material include, but are not restricted to, an oxide, a nitride, and combinations of an oxide and a nitride.

Referring to FIGS. 1A and 1B, the transistor cell 10 further includes a field electrode 31. The field electrode 31 is arranged in the drift region 11 and is dielectrically insulated from the drift region 11 by a field electrode dielectric 32. Referring to FIGS. 1A and 1B, the field electrode 31 may be implemented as an elongated electrode which, in the first lateral direction x, may have a length that is at least 50%, at least 70%, or at least 90% of a length of the drift region 11 in the first lateral direction x. The length of the drift region 11 in the first lateral direction x is the distance between the body region 13 and the drain region 14 (or the optional field-stop region) in the first lateral direction x. The length of the drift region 11 is, inter alia, dependent on a desired voltage blocking capability of the transistor device. For example, the transistor device is designed to have a voltage blocking capability that is selected from a range of between 10V and 100V. The field electrode may include a conventional field electrode material. Examples of the field electrode material include, but are not restricted to, a metal, a silicide, and a highly doped polycrystalline semiconductor material, such as polysilicon. The field electrode dielectric may include a conventional field electrode dielectric material. Examples of the field electrode dielectric material include, but are not restricted to, an oxide, a nitride, and combinations of an oxide and a nitride.

The transistor cell 10 further includes a source electrode 41 electrically connected to the source region 12, and a drain electrode 42 electrically connected to the drain region 14. In the embodiment shown in FIGS. 1A and 1B, both of the source electrode 41 and the drain electrode 42 are arranged in trenches of the semiconductor body 100 and, in the first lateral direction x, adjoin the source region 12 and the drain region 14, respectively. The source electrode 41 is electrically coupled to a source node S of the transistor device, the drain electrode 41 is electrically coupled to a drain node D, and the gate electrode 21 is electrically coupled to a gate node G. These source, drain, and gate nodes S, D, G are only schematically illustrated in FIGS. 1A and 1B. The field electrode 31 is either electrically connected to the source node G or the gate node 5.

According to one embodiment, the source electrode 41 is further connected to the body region 13. In the embodiment shown in FIGS. 1A and 1B, there is a connection region 15 of the second doping type that electrically connects the body region 13 to the source electrode 41. In this embodiment, the connection region 15, in the vertical direction z, is located below the source region 41 and the body region 13 and adjoins the source electrode 41 and the body region 13. In the first lateral direction x, the connection region 15 extends from the source electrode 41 along the source region 12 to the body region 13. According to one embodiment, the connection region 15, in the first lateral direction x, extends beyond the body region 13 into the drift region 11, but is spaced apart from the field electrode 31 and the field electrode dielectric 32, respectively.

According to one embodiment (shown in dashed lines in FIG. 1A), there is at least one further connection region 15' that connects the source electrode 41 to the body region 13. This further connection region 15' adjoins the source electrode 41 in the first lateral direction x. In the vertical direction z, the further connection region 15' may extend down to the connection region 15, or be spaced apart from the connection region 15.

The transistor device can be implemented as an n-type transistor device or a p-type transistor device. In the first case, the first doping type (the doping type of the drift region 11, the source region 12 and the drain region 14) is an n-type, and the second doping type (the doping type of the body region 13 and the connection region 15) is a p-type. In the second case, the first doping type is a p-type and the second doping type is an n-type. Furthermore, the transistor device can be implemented as an enhancement device or a depletion device. In an enhancement device, the body region 13 of the second doping type adjoins the gate dielectric 22. In the second case, there is a channel region 13' (shown in dashed lines in FIG. 1A) of the first doping type between the gate dielectric 22 and the body region 13.

The transistor device can be operated in a conventional way. That is, the transistor device can be switched on and off by applying a suitable drive potential to the gate electrode G. The transistor device is in an on-state when the drive potential applied to the gate electrode G is such that there is a conducting channel in the body region 13 along the gate dielectric between the source region 12 and the drift region 11, and the transistor device is in the off-state, when the drive potential applied to the gate node G is such that the conducting channel in the body region 13 between the source region 12 and the drift region 11 is interrupted. In the off-state, a space charge region (depletion region) may expand in the drift region 11 beginning at the pn-junction between the body region 13 and the drift region 11. For example, in an n-type transistor device, a space charge region expands in the drift region 11 when a positive voltage is applied between the drain node D and the source node S and when the transistor device is in the off-state. This space charge region is associated with ionized dopant atoms in the drift region 11 (in an n-type drift region 11, those ionized dopant atoms are positively charged). Counter charges to those ionized dopant atoms in the drift region 11 are provided by the body region 13 and by the field electrode 31. An avalanche breakdown at the pn-junction between the body region 13 and the drift region 11 may occur when the voltage applied between the drain node D and the source node S is such that a magnitude of an electrical field at the pn-junction reaches a critical level (often referred to as critical electrical field $E_{crit}$). The voltage level of the voltage between the drain node D and the source node S at which such avalanche breakdown may occur is, inter alia, dependent on a doping concentration of the drift region 11, a length of the drift region 11 in the first lateral direction x, the specific implementation of the field electrode 31, etc.

However, it is highly undesirable for an avalanche breakdown to occur at the pn-junction between the body region 13 and the drift region 11. An avalanche breakdown is associated with charge carriers flowing through the drift region 11. Those charge carriers are often referred to as hot charge carriers. Those hot charge carriers may get into the field electrode dielectric 32 where they may remain when the avalanche breakdown is over, that is, when the transistor device is unbiased. Those charge carriers remaining in the field electrode dielectric 32 may negatively influence the switching behavior of the transistor device. In particular, those charge carriers may increase the on-resistance of the transistor device in the on-state. The on-resistance is the electrical resistance of the transistor device between the source node S and the drain node D when the transistor device is in the on-state.

In order to prevent an avalanche breakdown from occurring at the pn-junction between the body region 13 and the drift region 11, the transistor device includes an avalanche bypass structure coupled between the source electrode 41 and the drain electrode 42. Such avalanche bypass structure is configured to bypass the drift region 11 when, in the off-state of the transistor device, the voltage between the drain node D and the source node S increases, but before an avalanche breakdown at the pn-junction between the body region 13 and the drift region 11 occurs. That is, a breakdown voltage of the avalanche bypass structure is lower than a breakdown voltage of the pn-junction between the body region 13 and the drift region 11. The breakdown voltage of the avalanche bypass structure is a voltage level of the voltage between the drain node D and the source node S at which the avalanche bypass structure, in the off-state of the transistor device, begins to bypass the drift region 11.

Referring to FIGS. 1A and 1B, the avalanche bypass structure, which is coupled between the source electrode 41 and the drain electrode 42 (the source node S and the drain node D), includes a first semiconductor layer 17 and a second semiconductor layer 18 of the first doping type. In the first lateral direction x, each of these first and second semiconductor layers 17, 18 may extend from below the source electrode 41 to below the drain electrode 42. The second semiconductor layer 18 has a higher doping concentration than the first semiconductor layer 17. For example, the doping concentration of the second semiconductor layer 18 is selected from a range of between 1E18 cm$^{-3}$ and 1E22 cm$^{-3}$, and the doping concentration of the second semiconductor layer 17 is selected from a range of between 1E12 cm$^{-3}$ and 1E17 cm$^{-3}$.

The first semiconductor layer 17 is arranged between the second semiconductor layer 18 and the drift region 1. In the embodiment shown in FIGS. 1A and 1B, the first semiconductor layer 17 adjoins the drift region 11. However, this is only an example. According to another embodiment (not shown), an insulation layer, such as an oxide, is arranged between the drift region 11 and the first semiconductor layer 17. Furthermore, the first semiconductor layer 17 is coupled to the source electrode 41 via a pn-junction. In the present embodiment, this pn-junction is formed between the connection region 15 and the first semiconductor layer 17. Referring to the above, the connection region 15 is electrically connected to the source electrode 41. Optionally, in order to provide for an ohmic contact between the source electrode 41 and the connection region 15, the connection region 15 includes a highly doped contact region 16 (illustrated in dotted lines in FIGS. 1A and 1B). Furthermore, the drain electrode 42 is electrically coupled to the second semiconductor layer 18. This electrical coupling between the drain electrode 42 and the second semiconductor layer 18 is represented by a resistor R in the embodiment shown in FIGS. 1A and 1B. This electrical coupling between the drain region 42 and the second semiconductor layer 18 can be implemented in many different ways, some of which are explained herein further below.

One way of operation of the avalanche bypass structure is explained in the following. Just for the purpose of illustration it is assumed that the transistor device is an n-transistor device. In this case, the first and the second semiconductor layers 17, 18 are n-doped, and the connection region 15 is p-doped. For the purpose of explanation it is further assumed that the transistor device is in the off-state and that a voltage level of a voltage between the drain node D and the source node S increases. By virtue of the coupling of the drain electrode 42 to the second semiconductor layer 18, an electrical potential in the second semiconductor layer 18 substantially corresponds to the electrical potential at the drain electrode 42 and the drain node D, respectively. The voltage between the drain node D and the source node S reverse biases the pn-junction between the source electrode 41 and the first semiconductor layer 17, that is, the pn-junction between the connection region 15 and the first semiconductor layer 17. When the voltage between the drain node D and the source node S is such that the magnitude of an electrical field at the pn-junction reaches a critical level, an avalanche breakdown at the pn-junction occurs. This avalanche breakdown causes a current flow between the source electrode 41 through the connection region 15, the first semiconductor layer 17, and the second semiconductor layer 18 to the drain electrode 42. Between the connection region 15 and the second semiconductor layer 18, the current flows substantially in the vertical direction z. The breakdown voltage of the avalanche bypass structure is, inter alia, dependent on the doping concentration of the first semiconductor layer 17, and a distance d between the pn-junction and the second semiconductor layer 18. In the embodiments shown in FIGS. 1A and 1B, this distance d substantially corresponds to a dimension of the first semiconductor layer 17 in the vertical direction z. However, this is only an example. The way how the drain electrode 42 is connected to the second semiconductor layer 18 mainly defines the electrical resistance of the avalanche bypass structure after an avalanche breakdown has occurred.

According to one embodiment (illustrated in dotted lines in FIGS. 1A and 1B), the connection region 16 extends into the first semiconductor layer 17. In this case, the distance d is smaller than the dimension (thickness) of the first semiconductor layer 17 in the vertical direction z. According to one embodiment, the field electrode 31 and the field electrode dielectric 32 are arranged in the drift region 11, only. According to another embodiment, the field electrode 31 and the field electrode dielectric 32 extend into the first semiconductor layer 17.

Some embodiments of how the drain electrode 42 can be connected to the second semiconductor layer 18 are shown in FIGS. 2-5. Each of these figures show a vertical cross sectional view of the semiconductor body 100 in the region where the drain electrode 42 is arranged.

Referring to FIG. 2, the drain electrode 42, in a vertical direction z of the semiconductor body 100, may extend through the first semiconductor layer 17 into the second semiconductor layer 18. In this embodiment, the drain electrode 42 is directly connected to the second semiconductor layer 18. Optionally, an insulation layer 43 is arranged between the drain electrode 42 and the first semiconductor layer 17 in those regions where the drain electrode 42 extends through the first semiconductor layer 17.

According to another embodiment, shown in FIG. 3, the drain electrode 42, in the vertical direction z, extends into the first semiconductor layer 17 but is distant to the second semiconductor layer 18. In this embodiment, the drain electrode 42 is electrically coupled to the second semiconductor layer 18 via a section of the first semiconductor layer 17 located between the drain electrode 42 and the second semiconductor layer 18. According to one embodiment, the drain electrode 42 is electrically connected to the first semiconductor layer 17 through a highly doped contact region 19, which provides for an ohmic contact between the drain electrode 42 and the first semiconductor layer 17. The doping concentration of this contact region 19 may correspond to the doping concentration of the drain region 14, or be different therefrom.

According to another embodiment, shown in FIG. 4, the drain electrode 42 and the drain node D, respectively, are electrically connected to the second semiconductor layer 18 via a contact plug 44. The contact plug 44 extends from the first surface 101 into the first semiconductor layer 17 (similar to the drain electrode 42 shown in FIG. 3), or through the first semiconductor layer 17 into the second semiconductor layer 18 (similar to the drain electrode 42 shown in FIG. 2). That is, the contact plug 44 may either directly contact the second semiconductor layer 18 (as shown in solid lines in FIG. 4), or may contact the second semiconductor layer 18 via a section of the first semiconductor layer 17 (as shown in dotted lines in FIG. 4). A highly doped contact region 19 may extend along the contact plug 44 in a vertical direction z. The drain electrode 42 is electrically connected to the contact plug 44. This electrical connection is only schematically shown in FIG. 4. According to one embodiment, the drain electrode 42 is electrically connected to the contact plug 44 through a wiring arrangement (not shown) arranged above the first surface 101 of the semiconductor body 100.

Figure 5:
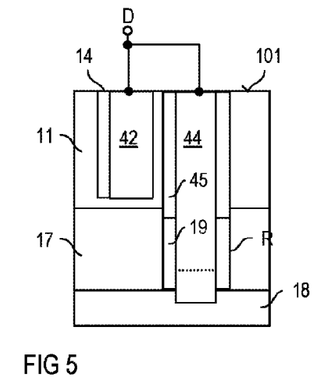
FIG. 5 shows yet another embodiment of an electrical connection between a drain electrode and an avalanche bypass structure in the transistor device.

According to another embodiment, shown in FIG. 5, the contact plug 44 is connected to the first semiconductor layer 17 by a highly doped contact region 19 and is dielectrically insulated from the semiconductor body 100 by an insulation layer 45 in a region between the first semiconductor layer 17 and the first surface 101. In each of the embodiments shown in FIGS. 1A-5, the drift region 11 is separated from the drain electrode 42 at leas by the drain region 14, so as to prevent leakage currents when the transistor device is in the off-state.

Figure 6:
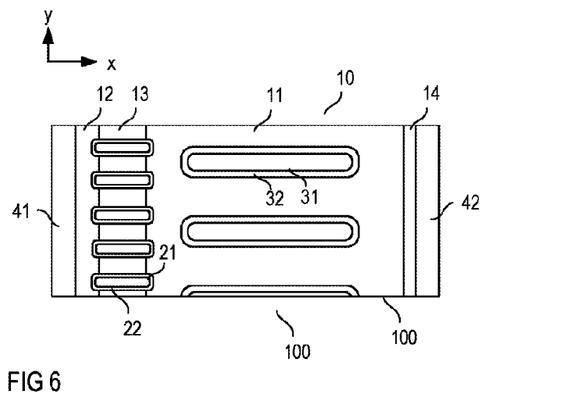
FIG. 6 shows a top view of one embodiment of a transistor device that includes several gate electrodes and several field electrodes.

FIG. 6 shows a top view of one transistor cell 10 according to one embodiment. In this embodiment, the transistor cell includes a plurality of gate electrodes 21 which are mutually spaced apart in a second lateral direction y, which is perpendicular to the first lateral direction x. Each of these gate electrodes 21 are connected to the gate node G (not shown in FIG. 6). Furthermore, the transistor cell 10 includes a plurality of field electrodes 31. These field electrodes 31 are mutually spaced apart in the second lateral direction y. In the embodiment shown in FIG. 6, there are more gate electrodes 21 than field electrodes 31. However, this is only an example. It is also possible to implement the transistor cell 10 with the same number of gate electrodes 21 and field electrodes 31. It is even possible, to implement the transistor cell 10 with more field electrodes 31 than gate electrodes 21.

Figure 7:
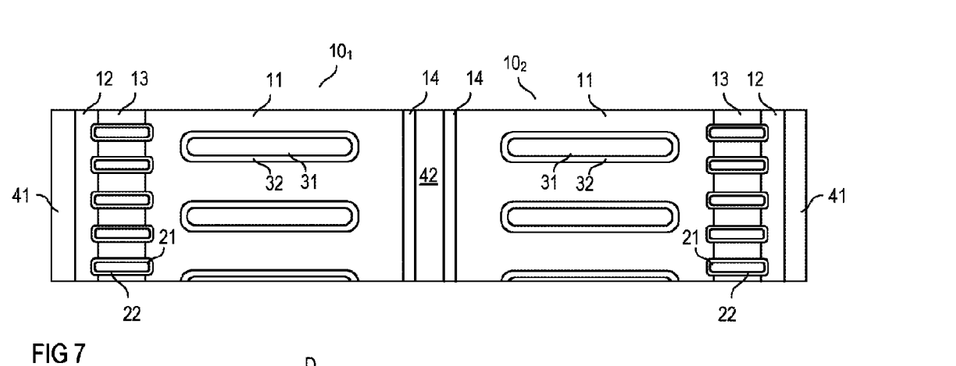
FIG. 7 shows a top view of one embodiment of a transistor device that includes several transistor cells.

FIG. 7 shows a top view of a transistor device that includes two transistor cells $10_1$, $10_2$. Each of these transistor cells $10_1$, $10_2$ can be implemented as explained with reference to transistor cell 10 in FIGS. 1-6 herein above. In the embodiment shown in FIG. 7, the two transistor cells $10_1$, $10_2$ share the drain electrode 42. That is, the drain region 14 of each of these transistor cells $10_1$, $10_2$ adjoins the drain electrode 42. For this, the two transistor cells $10_1$, $10_2$ are axially symmetric relative to an axis going through the drain electrode 42. The drain electrode 42 is electrically connected to the second semiconductor layer 18 in the way explained hereinbefore. In FIG. 7, only the drain electrode 42 is shown.

Figure 8:
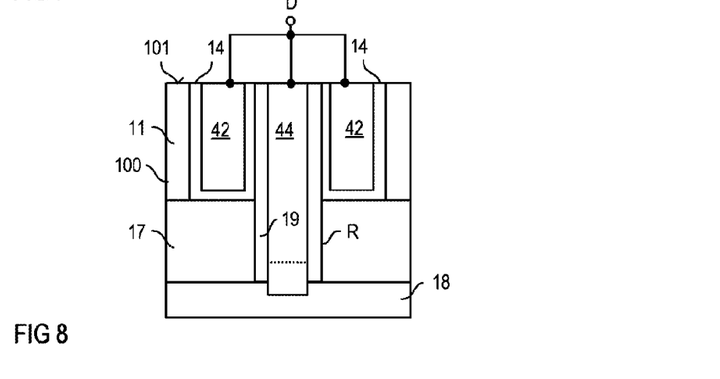
FIG. 8 shows one embodiment of an electrical connection between a drain electrode and an avalanche bypass structure in a transistor device having several transistor cells.

According to another embodiment, shown in FIG. 8, each transistor cell $10_1$, $10_2$ includes one drain electrode 42, wherein this drain electrode 42 is connected to the second semiconductor layer 18 via one contact plug 44. In this embodiment, the two transistor cells, from which only the drain electrodes 42 are shown in FIG. 8, are connected to the second semiconductor layer 18 through a common contact plug 44. This contact plug 44 may be implemented as explained with reference to FIG. 4 (as shown in FIG. 8) or as explained with reference to FIG. 5.

Figure 9:
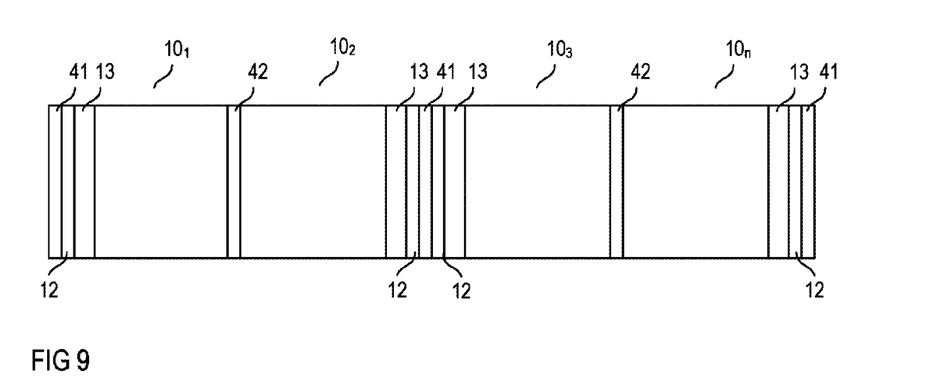
FIG. 9 shows a top view of another embodiment of a transistor device that includes several transistor cells.

According to another embodiment shown in FIG. 9, the transistor device includes a plurality of transistor cells $10_1$, $10_n$. From these transistor cells only the source regions 12, the body regions 13 and the source and drain electrodes 41, 42 are shown in FIG. 9. In this embodiment, the individual transistor cells $10_1$-$10_n$ are arranged such that two neighboring transistor cells $10_1$-$10_n$ share one source electrode and that two (other) neighboring transistor cells either share one drain electrode 42 (as shown in FIG. 9) or share the contact plug 44 (not shown) in the way explained with reference to FIG. 8. One transistor device may include several hundred transistor cells, or more. For example, the transistor device may include up to several millions transistor cells.

One embodiment of a method for producing one transistor cell in the transistor device explained hereinbefore is explained with reference to FIGS. 10A-10G below. Each of FIGS. 10A-10G shows a vertical cross sectional view of the semiconductor body 100 during individual process steps of the method.

Figure 10A:
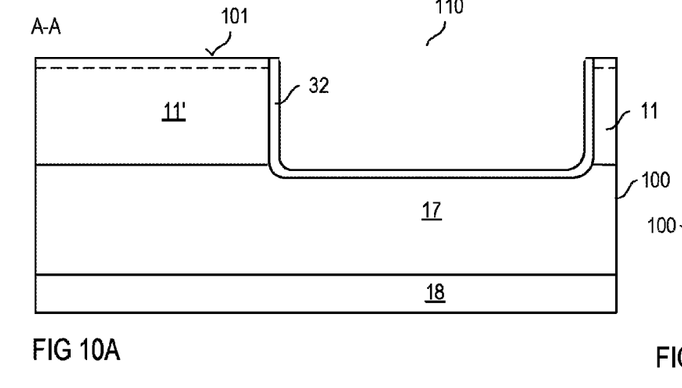
FIGS. 10A-10G illustrate one embodiment of a method for producing a transistor device.

Referring to FIG. 10A, the method includes providing the semiconductor body 100 with the second semiconductor layer 18, the first semiconductor layer 17 and a third semiconductor layer 11'. Sections of this third semiconductor layer 11' form the drift region 11 in the finished semiconductor device. The second layer 18 may be a semiconductor substrate, and the second layer 17 and the third layers 11' may be epitaxial layers grown on the substrate 18.

The method further includes forming a first trench 110 in the third semiconductor layer 11' and forming the field electrode dielectric 32 on sidewalls and the bottom of this first trench 110. In the vertical direction z, the first trench 110 may extend into the first semiconductor layer 17. According to another embodiment (not shown) the first trench 110 is formed such that a bottom of the trench is in the third semiconductor layer 11' and, therefore, distant to the first semiconductor layer 17. Forming the first trench 110 may include a conventional etching process using an etch mask (not shown) such as, for example, an anisotropic etching process. The field electrode dielectric 32 can be formed by depositing a dielectric layer and/or by thermally oxidizing the sidewalls and the bottom of the first trench 110. According to one embodiment, forming the field electrode dielectric 32 includes thermally oxidizing the sidewalls and the bottom of the first trench 110 to form an oxide layer, and depositing a dielectric layer on the oxide layer. Forming the field electrode dielectric 32 may further include forming the field electrode dielectric 32 on the first surface 101 of the semiconductor body 100. The field electrode dielectric 32 on the first surface 101 is illustrated in dashed lines in FIG. 10A.

Figure 10B:
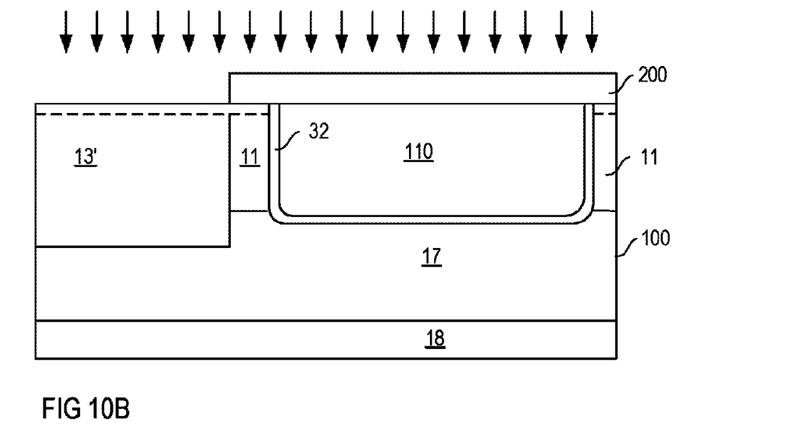

Referring to FIG. 10B, the method further includes forming a doped region 13' of the second doping type spaced apart from the field electrode dielectric 32 in the first lateral direction x. In the finished device, sections of this doped region 13' form the body region 13 and other sections form the contact region 16. Forming this doped region 13' may include an implantation process in which dopant atoms are implanted via the first surface 101 into the semiconductor body 100. An implantation mask 200 covers the first trench 101 and those regions of the semiconductor body 100 which are to be protected from being implanted. Those regions of the third semiconductor layer 11' into which dope atoms are not implanted in this implantation process form the drift region 11 of the transistor device. In the embodiment shown in FIG. 10B, the dopant atoms are implanted into the third semiconductor layer 11' and into sections of the first semiconductor layers 17. However, this is only an example. It is also possible to implant the dopant atoms substantially only into the third semiconductor layer 11'. Besides implanting the dopant atoms, forming the body region 13 includes an activation process (annealing process) in which the implanted dopant atoms are electrically activated. According to one embodiment, there is only one activation process that activates the dopant atoms of the body region 13 and that activates further dopant atoms implanted in other implantation processes explained below. That is, there may be a common annealing process after several implantation process.

Figure 10C:
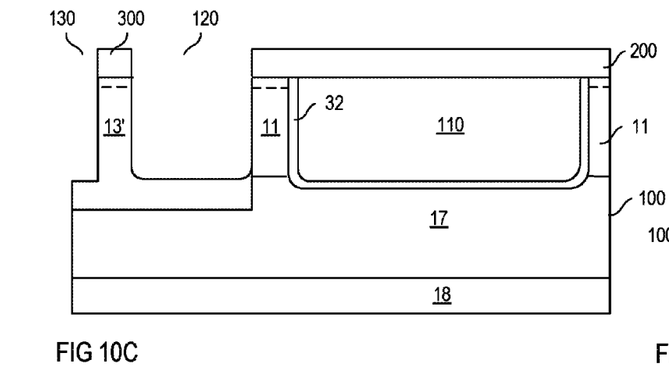

Referring to FIG. 10C, the method further includes forming a second trench 120 and a third trench 130. The second trench 120 serves to accommodate the gate electrode 21 and the gate dielectric 22, and the third trench 130 serves to accommodate the source electrode 41. Forming these second and third trenches 120, 130 may include conventional etching processes using an etch mask. According to one embodiment, the implantation mask 200 explained with reference to FIG. 10B forms a part of this etch mask. Another part 300 of the etch mask is formed above those regions of the semiconductor body 100 that are to be protected from being etched. According to another embodiment, the implantation mask 200 is removed and an etch mask similar to the two masks 200, 300 shown in FIG. 10C is formed.

In the embodiment shown in FIG. 10C, the first trench 110 (which is covered by the mask layer 200) and the second trench 12 are in line, that is, in one and the same vertical section plane. However, this is only an example and serves to illustrate the method. Referring to FIG. 6, those trenches and the gate and field electrodes 21, 31 located therein could also be offset relative to each other in the direction y.

Figure 10D:
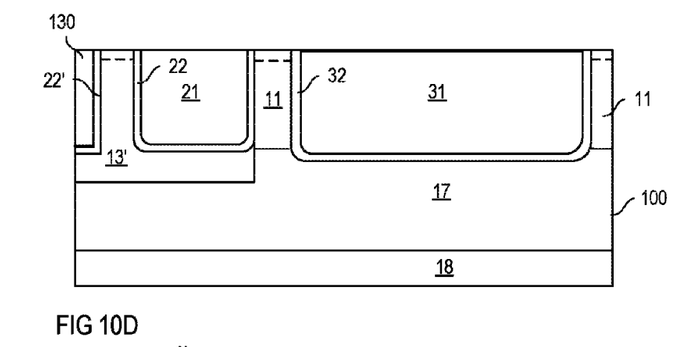

Referring to FIG. 10D, the method further includes forming the gate dielectric 22 and the gate electrode 21 in the second trench 120. Forming the gate dielectric 22 may include depositing a dielectric layer and/or thermally oxidizing sidewalls and the bottom of the second trench 120. According to one embodiment, forming the gate dielectric 22 includes thermally oxidizing the sidewalls and the bottom of the second trench 120 to form an oxide layer, and depositing a dielectric layer on the oxide layer. Forming the gate electrode 21 may include filling those sections of the second trench 120 remaining after forming the gate dielectric 22 with a gate electrode material such as, for example, a highly doped polycrystalline semiconductor material (for example, polysilicon). The method further includes forming the field electrode 31. The gate electrode 21 and the field electrode 31 can be formed by common process steps. That is, the mask layer 200 is removed before forming the gate electrode 21 so that when forming the gate electrode 21 in the second trench 120 the field electrode 31 is formed in the first trench 110. According to one embodiment, the mask layer 200 is removed before forming the gate dielectric 22. In this case, when forming the gate dielectric 22 a dielectric layer may be formed on the dielectric layer 32 in the first trench 110. These dielectric layers form the field electrode dielectric 32, in this embodiment. When forming the gate dielectric 22, a dielectric layer 22' may also be formed on the sidewalls and the bottom of the third trench 130.

Figures 10E, 11C:
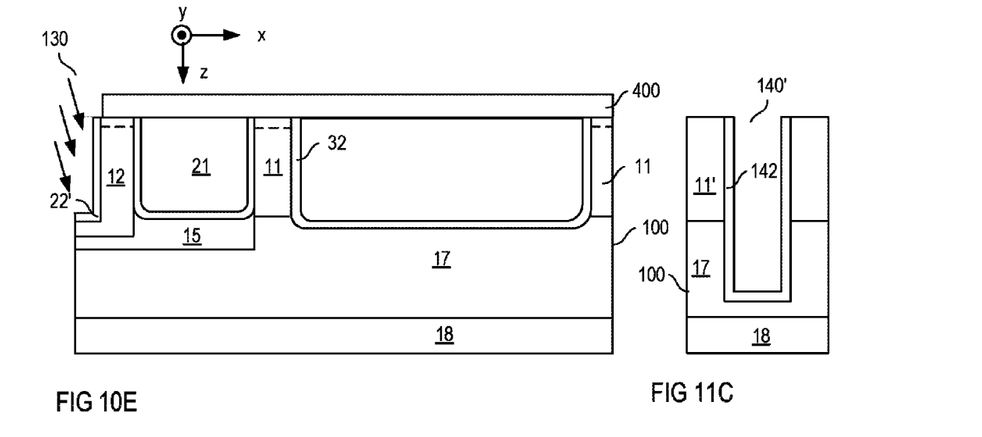
FIGS. 11A-11E illustrate another embodiment of a method for producing a transistor device.

When forming the gate electrode 21, the third trench 130 may be filled with an electrode material 21'. Referring to FIG. 10E, this electrode material 21' is removed from the third trench 130, and the first surface 101 of the semiconductor body 100, the gate electrode 21 and the field electrode are covered by another implantation mask 400. Furthermore, dopant atoms of the first doping type are implanted at least into the sidewalls of the third trench 130 in order to form the source region 12 between the third trench 130 and the gate dielectric 22. The dielectric layer 22' in the third trench may act as a scattering layer in this implantation process. However, it is also possible to remove the dielectric layer 22' before the implantation process. In this implantation process, dopant atoms of the first doping type may also implanted into the bottom of the third trench 130.

In the process shown in FIG. 10E, a section of the doped region 13' between the third trench 130 and the gate dielectric 22 is doped with dopants of the first doping type to form the source region 12. Those sections of the doped region 13' that are adjacent the gate dielectric 22 in the second lateral direction y (a direction perpendicular to the drawing plane) are not doped in this process and form the body region 13 in the finished device. Equivalently, those sections of the doped region 13' that are substantially below the gate dielectric in the vertical direction z are not doped in this process. These sections form a part of the connection region 15 in the finished device.

Figures 10F, 11D:
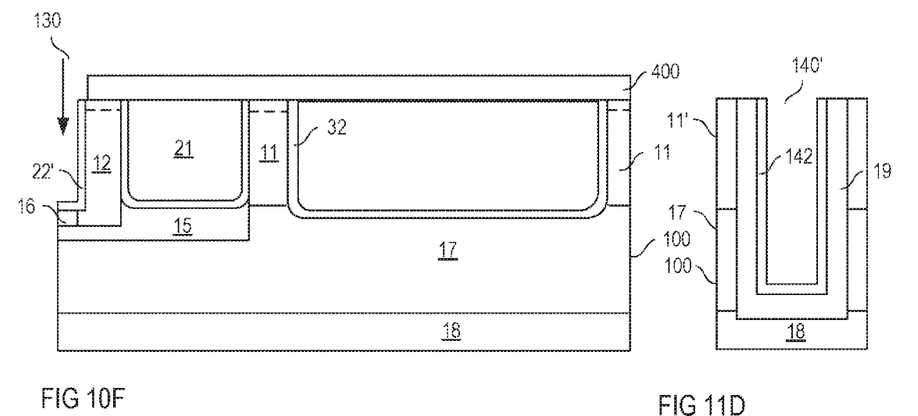

In next process steps, shown in FIG. 10F, dopant atoms of the second doping type are implanted into the bottom of the third trench 130 in order to form the contact region 16 between the bottom of the third trench 130 and the connection region 15.

Figures 10G, 11E:
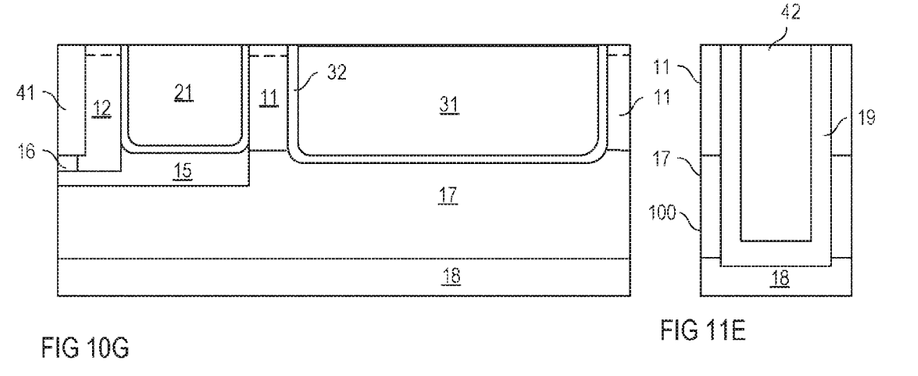

Referring to FIG. 10G, the source electrode 41 is formed in the third trench 130. Before forming the source electrode 41, the dielectric layer 22' is removed. Optionally, a contact layer is deposited on the bottom and the sidewalls of the third trench 130 before forming the source electrode 41. This contact layer may include a silicide such as, for example, titanium silicide.

One embodiment of a method for forming the drain electrode 42 is explained with reference to FIGS. 11A-11E herein below. Those FIGS. 11A-11E are shown next to FIGS. 10A, 10C, 10E, 10F, and 10G, respectively.

Figure 11A:
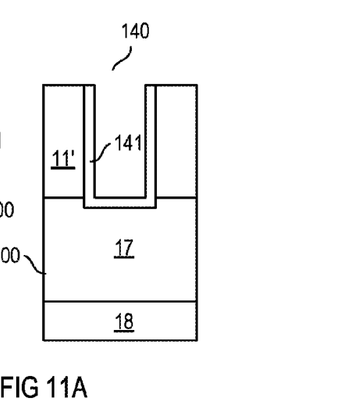

Referring to FIG. 11A, forming the drain electrode may include forming a fourth trench 140 in the first surface 101. Forming the fourth trench 140 may include using the same process steps in which the first trench 110 is formed. Furthermore, a dielectric layer 141 corresponding to field electrode dielectric 32 is formed in the fourth trench 140.

Figure 11B:
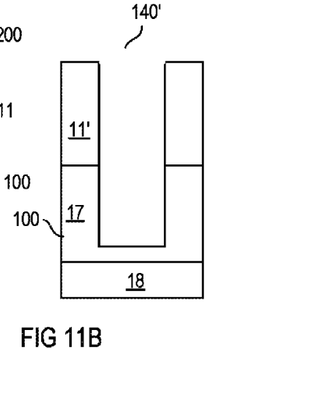

Referring to FIG. 11B, in further process steps, the fourth trench 140 is etched deeper into the semiconductor body 100, resulting in a deeper fourth trench 140'. These process steps may be the same process steps in which second and third trenches 120, 130 are etched. Before etching deeper the fourth trench 140, the dielectric layer 141 is removed from the sidewalls and the bottom of the fourth trench 140. That is, after forming the etch mask 200, 300 for etching the second and third trenches the dielectric layer 141 may be etched in the fourth trench 140. In this process, also the optional dielectric layer (illustrated by the dashed line in FIG. 10B) along the first surface 101 is removed in those sections not covered by the etch mask 200, 300. These sections not covered by the etch mask 200, 300 are the sections where the second and third trenches 120, 130 are to be etched.

The deeper fourth trench 140' may then be processed in the same way as the third trench 130. That is, a dielectric layer, corresponding to the gate dielectric 22, may be formed in the deeper fourth trench 140' and the fourth trench 140' may be filled with an electrode, with this electrode being removed afterwards.

FIG. 11C shows the deeper fourth trench 140' after forming the dielectric layer and removing the electrode. In the same process steps in which the source region 12 is produced adjacent the third trench 130, dopant atoms may be implanted into the sidewalls and the bottom of the deeper fourth trench 140' to form the contact region 19 explained before at least in the first semiconductor layer 17. In those process steps in which the contact region 16 is produced below the third trench 130, the deeper fourth trench 140' may covered by a protection layer.

Finally, as shown in FIG. 11D, the dielectric layer 142 is removed from the deeper trench 140' and the drain electrode 42 is formed in the deeper trench 140'. The same process steps in which the dielectric layer 22' is removed from the third trench 130 and the source electrode 41 is formed may be used to remove the dielectric layer 142 from the deeper trench 140' and to form the drain electrode 42.

Referring to FIGS. 4 and 8, the drain electrode 42 can be formed such that it is mainly located above the first semiconductor layer 17 and does not significantly extend into the first semiconductor layer 17. Such drain electrode 42 can be formed in a method that is based on the method explained with reference to FIGS. 11A-11E and is different from this method in that the etching process explained with reference to FIG. 11A is omitted. That is, the etch mask used to produce the first trench 110 covers those regions where the drain electrode 42 is to be produced so that the fourth trench 140 shown in FIG. 11A is not produced. The trench that accommodates the drain electrode 42 is formed in those process steps that form the second and third trench 120, 130. These are the process steps shown in FIGS. 10C and 11B, whereas—other than shown in FIG. 11B—the etching process, in the region of the later drain electrode, does not serve to extend the fourth trench 140 deeper, but serves to form a trench corresponding to the second and third trenches 120, 130.

In an embodiment in which the drain electrode 42 does not extend into the first semiconductor layer 17, the avalanche bypass structure may include a contact plug 44 extending at least into the first semiconductor layer 17, as shown in FIGS. 4 and 8. One embodiment of a method for forming such contact plug 44 is explained with reference to FIGS. 12A-12D. These figures show a vertical cross sectional view of the semiconductor body 100 in a region where the contact plug 44 is formed. Other device structures, such as the drain electrode 42 are not shown in these figures.

Figure 12A:
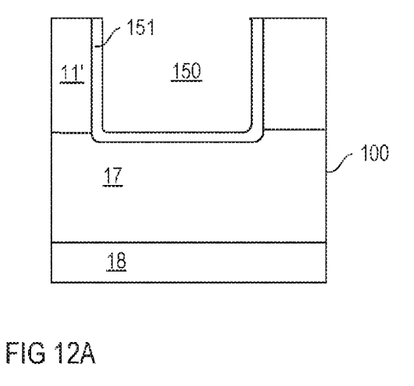
FIGS. 12A-12D illustrate one embodiment of a method for forming a contact plug of the avalanche bypass structure.

Referring to FIG. 12A, the method includes forming a fifth trench 150 and forming a dielectric layer 151' on sidewalls and a bottom of this fifth trench 150. The fifth trench 150 and the dielectric layer 151' are formed in the third semiconductor layer 11' and may be formed by the same process steps explained with reference to FIG. 10A that form the first trench 110 and the field electrode dielectric 32.

Figure 12B:
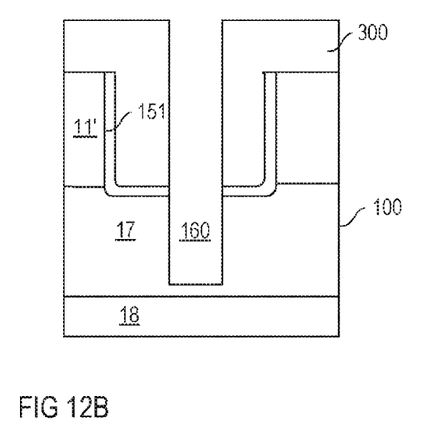

Referring to FIG. 12B, the method further includes forming a sixth trench 160 in the bottom of the fifth trench 150. This sixth trench 160 may be formed by the same process steps explained with reference to FIG. 10C that form the second trench 120 and the third trench 130. Thus, the etch mask 200, 300 may be used to etch the second trench 120, the third trench 130, and the sixth trench 160. The sixth trench 160 may be formed to extend into the second semiconductor layer 18 (as shown), or to have its bottom distant to the second semiconductor layer 18.

Figure 12C:
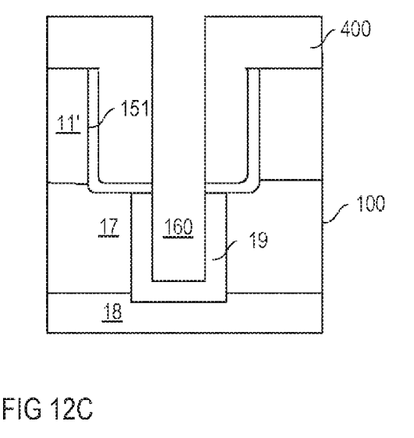
Figure 12D:
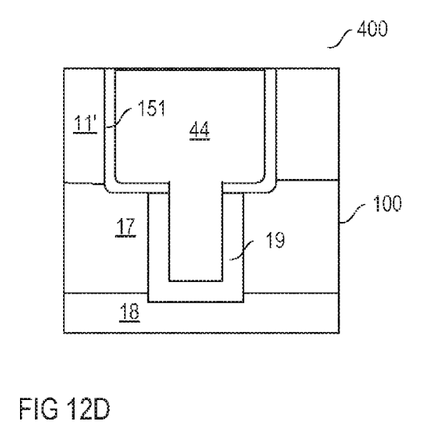

Referring to FIG. 12C, the method further includes forming the contact region 19 along the sidewalls and below the bottom of the sixth trench. The contact region 19 may be formed by the same process steps explained with reference to FIG. 10E that form the source region 12 along the sidewalls of the second trench 120. In FIG. 12C, reference character 400 denotes the implantation mask explained with reference to FIG. 10E. Furthermore, as shown in FIG. 12D, the method includes forming the contact plug 44 in the fifth and sixth trench after removing the implantation mask 400. The contact plug 44 may be formed by the same process steps explained with reference to FIG. 10G that form the source electrode 41.

The invention claimed is:

1. A transistor device comprising at least one transistor cell, wherein the at least one transistor cell comprises:
    in a semiconductor body, a drift region of a first doping type, a source region of a first doping type, a body region of a second doping type, and a drain region of the first doping type, wherein the body region is arranged between the source region and the drift region, wherein the drift region is arranged between the body region and the drain region, and wherein the source region and the drain region are spaced apart in a first lateral direction of the semiconductor body;
a gate electrode adjacent the body region and dielectrically insulated from the body region by a gate dielectric;
a field electrode arranged in the drift region and dielectrically insulated from the drift region by a field electrode dielectric;
a source electrode electrically connected to the source region and the body region and arranged in a trench extending from a first surface of the semiconductor body into the semiconductor body;
a drain electrode electrically connected to the drain region and arranged in a trench extending from a first surface of the semiconductor body into the semiconductor body; and
an avalanche bypass structure coupled between the source electrode and the drain electrode and comprising a first semiconductor layer of the first doping type, a second semiconductor layer of the first doping type, and a pn-junction arranged between the first semiconductor layer and the source electrode, wherein the second semiconductor layer has a higher doping concentration than the first semiconductor layer, wherein the first semiconductor layer is arranged between the second semiconductor layer and the drift region, and wherein the drain electrode is electrically connected to the second semiconductor layer.

2. The transistor device of claim 1,
wherein the source electrode is connected to the body region via a connection region of the second doping type, and
wherein the connection region adjoins the first semiconductor layer thereby forming the pn-junction between the first semiconductor layer and the source electrode.

3. The transistor device of claim 2,
wherein the connection region is arranged below the source electrode in a vertical direction of the semiconductor body.

4. The transistor device of claim 3, further comprising:
a further connection region connecting the source electrode to the body region and adjoining the source electrode in the first lateral direction.

5. The transistor device of claim 3,
wherein the connection region extends beyond the body region in the first lateral direction.

6. The transistor device of claim 1,
wherein the drain electrode extends into the first semiconductor layer and is electrically connected to the first semiconductor layer.

7. The transistor device of claim 6,
wherein the drain electrode extends into the second semiconductor layer.

8. The transistor device of claim 1, further comprising:
a connection electrode electrically connected to the drain electrode and electrically connected to at least one of the first semiconductor layer and the second semiconductor layer.

9. The transistor device of claim 1, wherein the field electrode is connected to one of the source electrode and the gate electrode.

10. The transistor device of claim 1,
wherein the gate electrode is arranged in a trench extending from the first surface of the semiconductor body into the body region.

11. The transistor device of claim 1,
wherein the transistor cell comprises a plurality of gate electrodes connected to a gate node.

12. The transistor device of claim 1,
wherein the transistor cell comprises a plurality of field electrodes.

13. The transistor device of claim 1, comprising a plurality of transistor cells successively arranged in the first lateral direction of the semiconductor body.

14. The transistor device of claim 13,
wherein the plurality of transistor cells share the second semiconductor layer.

15. The transistor device of claim 13,
wherein the plurality of transistor cells comprises first type transistor cells and second type transistor cells,
wherein first type transistor cells and second type transistor cells are arranged alternatingly in the first lateral direction, and
wherein the first type transistor cells and the second type transistor cells have opposite current flow directions.

16. The transistor device of claim 15,
wherein each of the plurality first type transistor cells shares the source electrode with one of the plurality of second type transistor cells.

17. The transistor device of claim 16,
wherein each of the plurality first type transistor cells shares the drain electrode with another one of the plurality of second type transistor cells.

18. The transistor device of claim 16,
wherein each of the plurality first type transistor cells shares a connection electrode connected between the drain electrode and at least one of the first semiconductor layer and the second semiconductor layer with another one of the plurality of second type transistor cells.

* * * * *